TUNING CIRCUIT FOR RESISTOR-CAPACITOR OSCILLATORS

Filed Oct. 25, 1948

3 Sheets-Sheet 1

Inventor
SAMUEL PAYNE

By [signature]

Attorney

Nov. 25, 1952 S. PAYNE 2,619,534

TUNING CIRCUIT FOR RESISTOR-CAPACITOR OSCILLATORS

Filed Oct. 25, 1948 3 Sheets-Sheet 2

Inventor
SAMUEL PAYNE

By

Attorney

TUNING CIRCUIT FOR RESISTOR-CAPACITOR OSCILLATORS

Filed Oct. 25, 1948 3 Sheets-Sheet 3

Inventor
SAMUEL PAYNE

Attorney

Patented Nov. 25, 1952

2,619,534

UNITED STATES PATENT OFFICE 2,619,534

TUNING CIRCUIT FOR RESISTOR-CAPACITOR OSCILLATORS

Samuel Payne, Denver, Colo.

Application October 25, 1948, Serial No. 56,318

5 Claims. (Cl. 178—44)

This invention relates to resistor-capacitor circuits wherein combinations of resistors and capacitors are used to measure an unknown frequency or to establish a desired frequency.

An object of this invention is to provide calibrated banks of resistors and capacitors adaptable to use in resistor-capacitor circuits to measure an unknown frequency.

Another object of this invention is to provide calibrated banks of resistors and capacitors wherethrough definite values of resistance and capacitance may be introduced into an oscillator to attain a predetermined frequency.

Yet another object of this invention is to provide calibrated banks of resistors and capacitors adaptable to use as a resistor-capacitor filter wherethrough predetermined frequencies may be selectively passed.

Another object of this invention is to provide calibrated banks of resistors and capacitors for use in a Wien bridge to selectively apply definite values of resistance and capacitance for measurement of an unknown frequency.

Still another object of this invention is to provide calibrated banks of resistors and capacitors for use with a resistor-capacitor oscillator, wherethrough definite values of resistance and capacitance may be introduced to establish a predetermined frequency.

Another object of this invention is to provide calibrated banks of resistors and capacitors for use with a phase-shift oscillator, wherethrough definite values of resistance and capacitance may be introduced to establish a preedtermined frequency.

Another object of this invention is to provide for direct measurement of frequency through the calibration of banks of resistors and capacitors to read in terms of frequency.

Another object of this invention is to provide calibrated banks of resistors and capacitors adaptable to use in resistor-capacitor circuits, said resistors and capacitors being calibrated to read directly in terms of frequency and arranged with the elements in decades to facilitate adjustments.

Another object of this invention is to provide calibrated banks of resistors and capacitors for the measurement of frequency in resistor-capacitor circuits, the said banks of resistors, and capacitors, once calibrated, being correlated to eliminate operative and adjustive errors.

Another object of this invention is to provide calibrated banks of resistors and capacitors for the measurement of frequency in resistor-capacitor circuits, the said banks of resistors and capacitors being selective over a wide range of frequencies.

Yet another object of this invention is to provide calibrated banks of resistors and capacitors for the measurement of frequency in resistor-capacitor circuits, the said banks of resistors and capacitors being of rugged and dependable construction.

These and other objects will be apparent from the detailed description of the invention given in connection with the various figures of the drawings in which.

Figure 7:
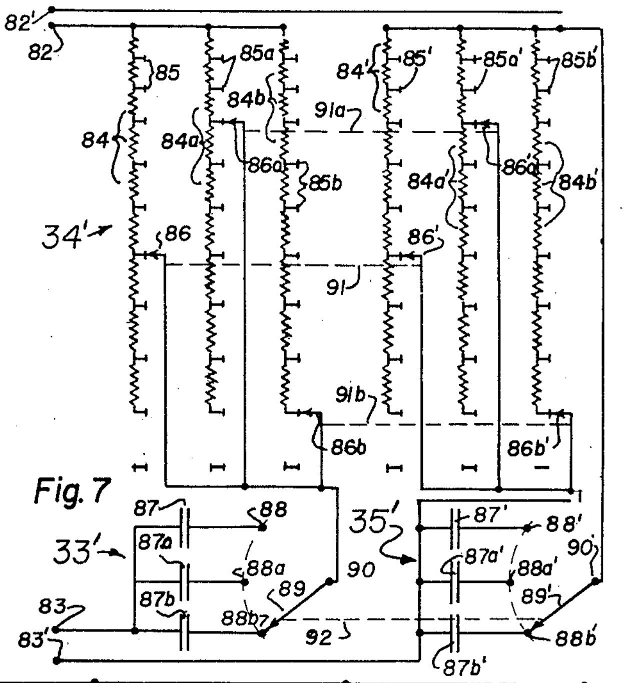
Figure 7 shows a typical circuit of the invention employable in association with the circuits shown in Figures 3 and 4.
Figure 9:
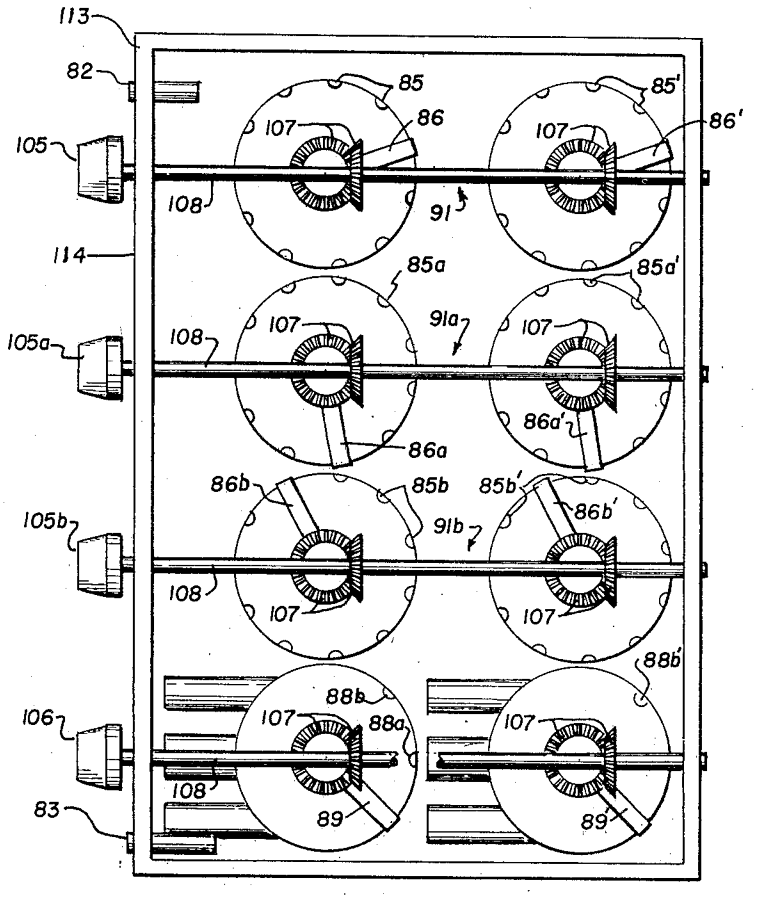

Figure 9 typifies a mechanical arrangement effective for control and adjustment of the circuit, which may be used in the invention in the embodiment according to Figure 7.

Figures 10, 11, 12:
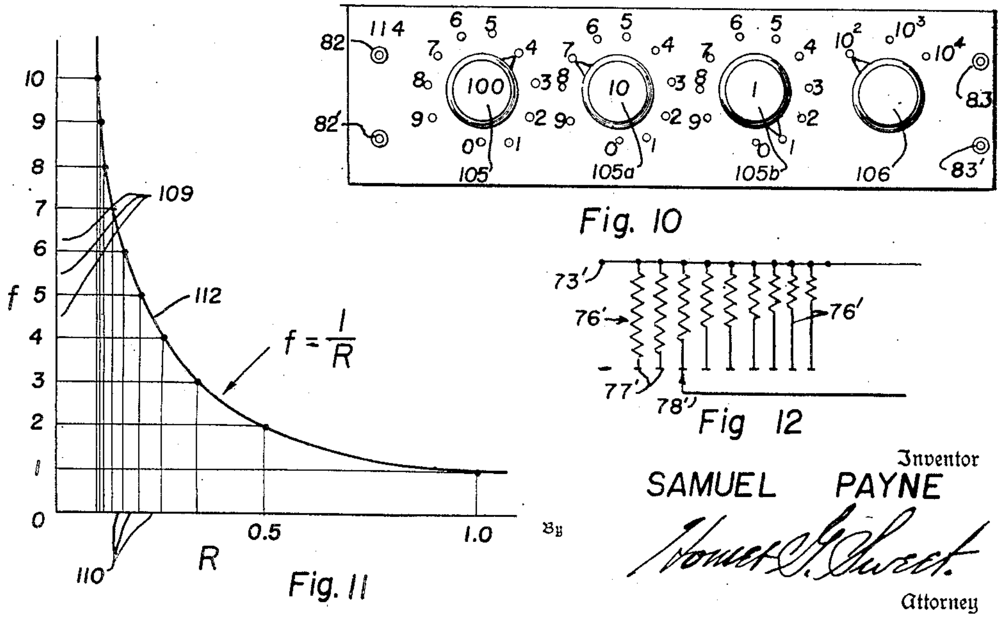

Figure 10 typifies a control panel for the arrangement of Figure 9.

Figure 11 is a diagram of an hyperbolic curve depicting the functional interrelation of frequency and maintenance values in typical circuits shown.

Figure 6:
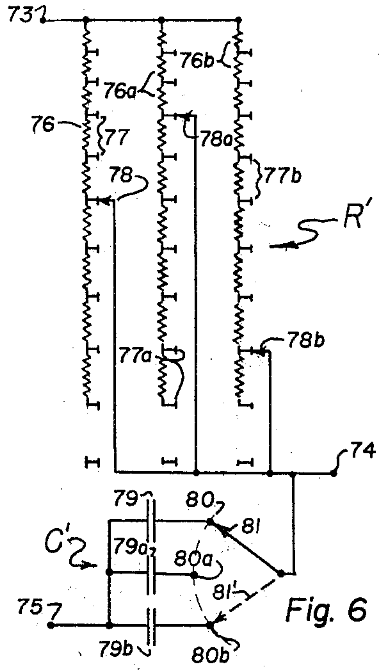
Figure 6 shows a typical circuit of the invention employable in association with the circuits shown in Figures 1 and 2.

Figure 12 is a fragmentary portion of the circuit shown in Figure 6 illustrating an alternative embodiment of the invention.

As is well known, an arrangement of resistors, capacitors and inductors within a given circuit will be in resonance when a particular frequency is imposed upon the circuit. This resonant property may be used to advantage in several ways. One use is to restrict circuit responses to particular frequencies. Another use is to measure an unknown frequency by relating the circuit characteristics to the values of resistance, capacitance, and inductance within the circuit. Still another use is to establish an oscillating current of given frequency. These, and many other uses deriving from the resonant properties of resistor-inductor-capacitor circuits are well known in the art.

In working with audio and radio frequencies, the use of inductors is often undesirable because of their susceptibility to external influences; therefore, circuits containing only resistors and capacitors, commonly referred to as RC circuits, are often preferred. Several different RC circuits have a similar property in that the resonant frequency may be expressed by the relation:

$$f=\frac{K}{RC}$$

where $f$ is frequency, K is a constant, R is resistance, and C is capacitance. The present invention is concerned with means wherethrough measurement or determination of frequency may be facilitated in those circuits in which the resonant frequency is expressed by such relation. To emphasize the applicability of this invention and to show the wide scope of its possible uses, several well known circuits are first described whereto various embodiments of the invention are applicable with advantage.

Figure 1:
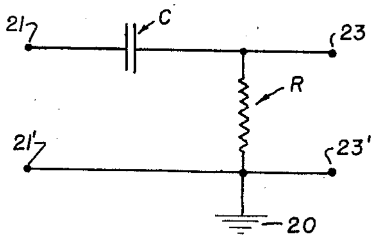
Figure 1 shows a portion of a circuit containing a high-pass resistor-capacitor filter.
Figure 2:
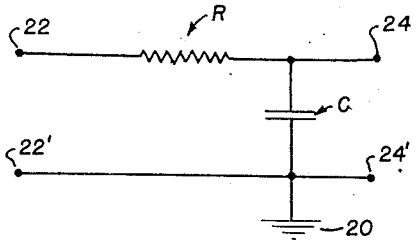
Figure 2 shows a portion of a circuit containing a low-pass resistor-capacitor filter.

Conventional RC filters consist of a resistor and capacitor placed in series as shown in Figures 1 and 2. The purpose of such filters is to allow passage of a particular range of frequencies depending upon the values of resistance and capacitance and upon the arrangement of the elements in the circuit. Such filters are often used as simple attenuating sections of broad frequency discriminating characteristics in complex electronic circuits. In their operation an alternating voltage is placed across terminals 21 and 21′ of the filter of Figure 1, and terminals 22 and 22′ of Figure 2. The output of these filters will be received from 23 and 23′ of Figure 1, and 24 and 24′ of Figure 2. In the high pass filter of Figure 1, at frequencies below the resonant value the output at 23—23′ will be attenuated, while in the low pass filter of Figure 2, at frequencies above the resonant value the output of 24—24′ will be attenuated; in both instances, the point of attenuation being at the resonant frequency. Now this resonant frequency may be expressed by the relationship:

$$f=\frac{K}{RC}$$

wherefore, the present invention may be used in RC filters as will be later described.

Figure 3:
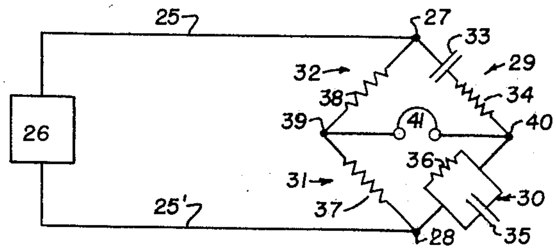
Figure 3 shows the circuit including a Wien bridge.

The Wien bridge shown in Figure 3 is often used for measurment of an unknown frequency. This bridge is similar to a Wheatstone bridge in form but contains capacitors as well as resistors in two legs of the bridge. Leads 25 and 25′ are connected with alternating current source 26 and are attached to the bridge at terminals 27 and 28. Between these terminals extend the four legs of the bridge, 29, 30, 31, and 32, to form two separate circuits between the leads 25 and 25′. Lead 29 includes capacitor 33 and resistor 34 in series. Lead 30 includes capacitor 35 and resistor 36 in parallel. In leads 31 and 32 there are resistors 37 and 38 respectively. When this circuit is tuned to the frequency of the alternating current source 26 there will be a balance between terminals 39 and 40 which may be noted by null indicator 41 in the circuit connecting said terminals 39 and 40. The indicator 41 may consist of headphones if the frequencies are in the audible range or may consist of a meter or a suitable device for indications at higher frequencies. A definite relationship exists between resonant or tuning frequency and the capacitances of 33 and 35 and resistances 34 and 36 which may be expressed by the relation:

$$f=\frac{K}{\sqrt{C_{33}C_{35}R_{34}R_{36}}}$$

However, where the capacitance of 33 is equal to that of 35, and the resistance of 34 is equal to that of 36, the relation may be expressed as:

$$f=\frac{K}{RC}$$

Figure 4:
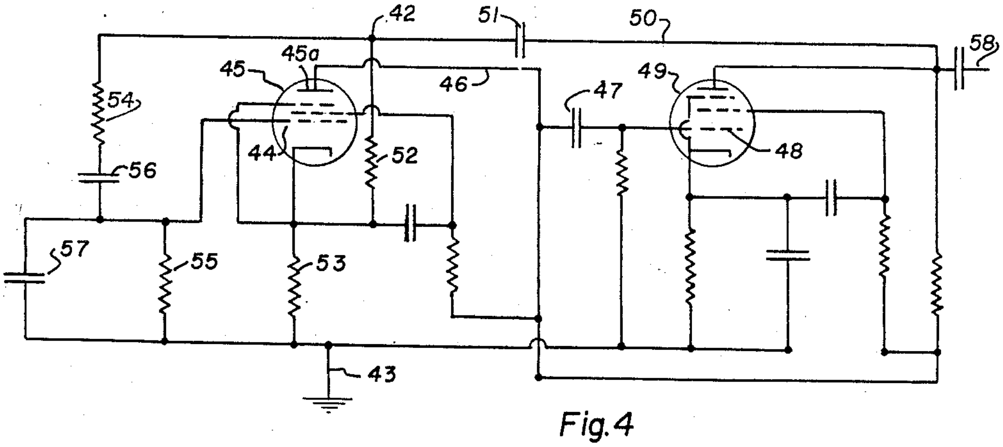
Figure 4 shows the circuit of a resistor-capacitor oscillator.

Wherefore, the present invention may be used in the Wien bridge as will be later described.

Where it is desirable to generate an alternating current at a given frequency an RC oscillator such as is shown in Figure 4 is conventional. A voltage is imposed across the circuit at points 42 and 43, introducing a potential on control grid 44 of vacuum tube 45. This potential is transmitted through anode 45*a* to lead 46, but the resulting voltage in lead 46 is 180 degrees out of phase with the voltage on control grid. The voltage in lead 46 will pass through capacitor 47 to control grid 48 of tube 49. There, the voltage is further amplified and the phase is again shifted 180 degrees, the resulting voltage in lead 50 being fed back through capacitor 51 to point 42, in phase with the original starting voltage. The amplified impulse passes through resistor 52 and resistor 53 to control the amplification of tube 45. Also, the voltage from 42 is passed in the bridge circuit comprising resistors 54 and 55 and capacitors 56 and 57. Except for resonant frequency, this group of resistors and capacitors will introduce a further phase shift and a damping out of impulses. Accordingly, the only impulses amplified are those at resonant frequency, and continuous oscillation is thus set up. To use this circuit a takeoff may be placed at 58. It is to be noted that this bridge, consisting of resistors 54 and 55 and capacitors 56 and 57, is essentially a Wien bridge, and the resonant frequency may be expressed by the relationship:

$$f=\frac{K}{\sqrt{R_{54}R_{55}C_{56}C_{57}}}$$

or:

$$f=\frac{K}{RC}$$

where the resistance of 54 is equal to that of 55, and the capacitance of 56 is equal to that of 57. Wherefore, the present invention may be used in an RC oscillator as will be later described.

Figure 5:
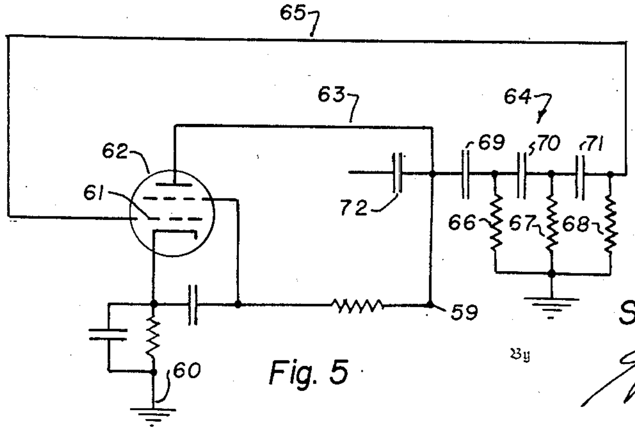
Figure 5 shows the circuit of a phase-shift oscillator.

The phase-shift oscillator shown in Figure 5 is another circuit with which it is possible to generate an oscillating current at a given frequency. A random impulse imparted to grid 61 of tube 62 controls an amplified potential which is passed through the tube plate and to lead 63, but the resulting voltage in lead 63 is 180 degrees out of phase with the voltage on control grid 61. The voltage in lead 63 is fed into resistor-condensor bank generally designated at 64 where the phase is again shifted 180 degrees and fed back through lead 65 to grid 61. The resistor-condensor bank 64, containing resistors 66, 67, and 68 and capacitors 69, 70, 71, is a frequency-control phase-shifting circuit, but a phase shift of 180 degrees occurs only at its resonant frequency. Therefore, because of damping action only resonant frequency will be regenerated. To use this circuit a takeoff may be placed at 72. The resonant frequency of the phase-shift oscillator may be expressed by the relationship:

$$f=\frac{K}{RC}$$

whenever resistors 66, 67, and 68 are equal, and capacitors 69, 70, and 71 are equal. Therefore, the present invention may be used in a phase-shift oscillator as will be later described.

One advantage of an RC circuit is that it may be used over a wide range of frequencies, a desired frequency being obtained by adjusting the resistance or capacitance within the circuit. Instruments which change resistance may consist of slide type resistors or a group of resistors in series. Instruments which change capacitance may consist of variable capacitors or a group of capacitors in parallel. However, all of the commonly known and used instruments have certain undesirable features. While slide type resistors and variable capacitors are readily adjustable over wide ranges of frequencies, they are often not sufficiently accurate for the precise adjustments necessary to establish desired frequency, and such instruments are subject to operative errors when being positioned. For precise measurements it is more desirable to use groups of laboratory-calibrated resistors and capacitors, placing in the circuit sufficient such elements to establish the desired frequency; however, the disadvantage lies in the fact that large numbers of elements must be on hand for a wide range of application. Moreover, conventional instruments of this type are not conveniently calibrated to read directly in terms of frequency because of the inverse relation of frequency to resistance and capacitance and computations are hence necessary to convert the values of resistance and capacitance and computations are hence necessary to convert the values of resistance and capacitance into the equivalent freuency. To determine the frequency of RC filters, the solution of a problem of the type $$f=\frac{K}{RC}$$

is required. In circuits such as the Wien bridge or phase-shift oscillator problems involving more complicated expressions arise as described above. Since the solution of such problems becomes onerous it is often desirable to make the resistance and capacitance in the different branches of the circuit the same, thereby obtaining a more elementary expression of the type $$f=\frac{K}{RC}$$

Howeved, in using this method to determine an unknown frequency a difficult problem or double-simultaneous adjustment may arise unless mechanical means are provided for maintaining the same resistance and capacitance in the different branches of the circuit at all times.

My invention provides a calibrated control bank for determination of frequency in RC circuits, wherein the use of fixed resistors and fixed capacitors avoids the objectionable features of variable controls. The resistors are preferably made of properly stabilized material and calibrated against fixed standards, and the capacitors are also preferably made of select stable materials and calibrated against fixed standards. The control bank may consist of single, double, or multiple units depending upon the circuit in which it is to be used. In each unit paralleled groups of series-connected resistors are in circuit with one or more capacitors, the resistors and capacitors being calibrated directly in terms of frequency and arranged in decades whereby a maximum number of adjustments is made possible with a minimum number of elements. Where multiple units are used, the elements within each unit will have the same values as those of other units and the contact controls of each unit are mechanically interconnected with others to obtain parallelism in operation and adjustments of the several units.

The single unit R.C. control bank shown in Figure 6 may be used as an R.C. filter; the resistor bank R′ and the capacitor group C′ constituting the essential elements of the filter. Appropriate connections may be made at terminals 73, 74, and 75 to obtain the desired type of filter, such as those shown in Figures 1 and 2. The resistor bank R′ consists of a plurality of groups of series-connected resistors, the said groups being connected in parallel in the lead from terminal 73. While three groups are shown at 76, **76*a*, and 76*b*, such being sufficient to illustrate the embodiment of the invention, additional groups could be used. There are preferably nine resistors in each group to facilitate calibration in decades as will be later explained, and between adjacent resistors there are contact terminals as at 77, 77*a*, and 77*b*, with which movable contacts 78, 78*a*, and 78*b* selectively engage to close the circuits. The capacitor group C′ may consist of a plurality of capacitor units, 79, 79*a*, and 79*b* being shown, connected in parallel in the lead from terminal 75. These capacitors are also connected through leads with contact terminals 80, 80*a*, and 80*b* respectively, as shown. Movable contact arm 81, which serves contact 74, connects with one of the terminals 80, 80*a*, or 80*b* to place one of the capacitors in the circuit. Should it be desirable, another contact arm 81′** may be provided to place several capacitors in circuit simultaneously.

The double unit R.C. control bank of Figure 7 may be used in a Wien bridge or in an R.C. oscillator as shown in Figures 3 and 4. One part of this double unit consists of resistor bank 34′ connected in series with capacitor group 33′ while the other part consists of resistor bank 36′ connected in parallel with capacitor group 35′. Appropriate connections may be made at terminals 82, 82′, 83, and 83′ to place the control bank in the desired circuit. In a Wien bridge, as shown in Figure 3, resistor 34 and capacitor 33 would be replaced by resistor bank 34′ and capacitor group 33′ while resistor 36 and capacitor 35 would be replaced by resistor bank 36′ and capacitor group 35′. In an R.C. oscillator, as shown in Figure 4, resistor 54 and capacitor 56 would be replaced by resistor bank 34′ and capacitor group 33′ while resistor 55 and capacitor 57 would be replaced by resistor bank 36′ and capacitor group 35′.

The elements comprising the double unit are similar to those of the single unit R.C. control bank above described. Resistor bank 34′ consists of a plurality of groups of series-connected resistors, 84, **84*a*, and 84*b* being shown, the said groups being connected in parallel in the lead from terminal 82. Between adjacent resistors there are contact terminals 85, 85*a*, and 85*b* with which movable contacts 86, 86*a*, and 86*b* engage to selectively close the circuits. Resistor bank 36′ is similar to 34′ consisting of groups containing resistors 84′, 84*a*′, and 84*b*′**, with contact terminals 85′, 85a′, and 85b′ between said resistors, and with movable contacts 86′, 86a′, and 86b′ to close the circuits. In capacitor group 33′ there is a plurality of capacitors 87, 87a, and 87b connected in parallel in the lead from terminal 83. These capacitors are also connected through leads with contact terminals 88, 88a, and 88b as shown. Movable contact arm 89, serving terminal 90, selectively engages with one of the terminals 88, 88a, or 88b to place one of the capacitors in the circuit. The capacitor group 35′ is similar to 33′ consisting of capacitors 87′, 87a′, and 87b connected to contact terminals 88′, 88a′, and 88b′, and movable contact arm 89′. To position contact arm 86 in engagement with a contact point corresponding to that engaged by contact arm 86′, there is provided a mechanical linkage indicated at 91. A similar linkage 91a is provided between contact arms 86a and 86a′, and linkage 91b is provided between contact arms 86b and 86b′. Further, a similar linkage 92 interlinks movable contact arms 89 and 89′.

Figure 8:
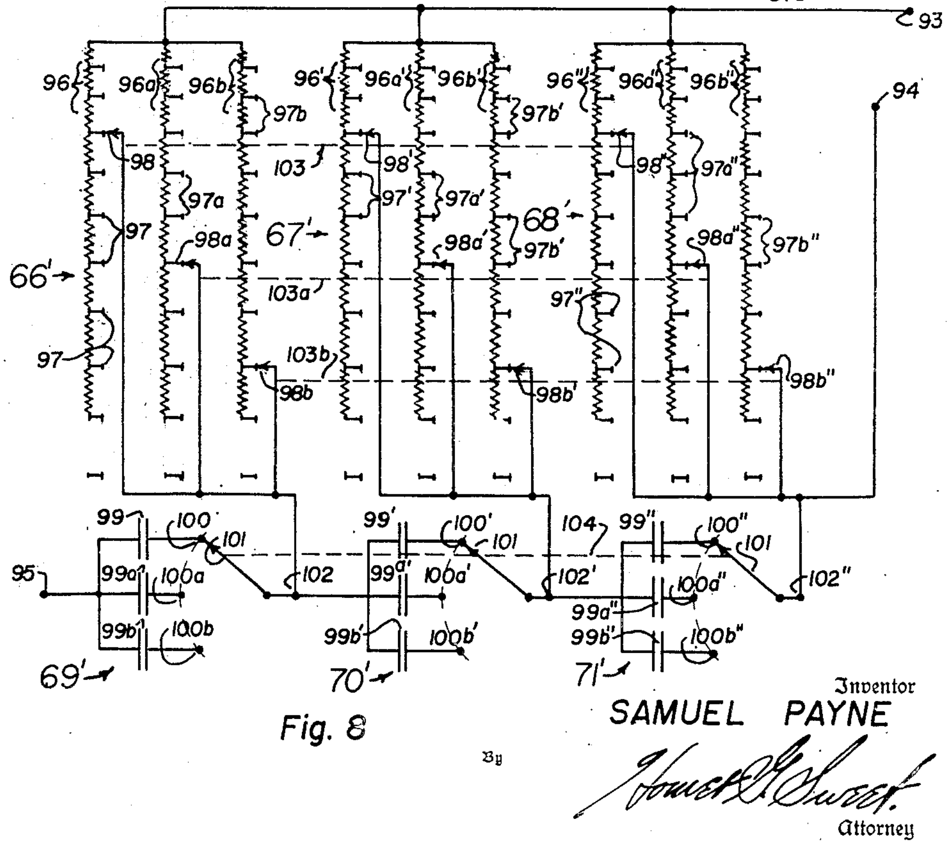
Figure 8 shows a typical circuit of the invention employable in association with the circuit shown in Figure 5.

The triple unit R.C. control bank of Figure 8 may be used in a phase shift oscillator as shown in Figure 5. This triple unit consists of resistor banks 66′, 67′ and 68′ and capacitor groups 69′, 70′, and 71′ which form a network interconnected in parallel and in series in the same manner as resistors 66, 67, and 68, and capacitors 69, 70, and 71 of Figure 5. In application to a phase shift oscillator, the resistors 66, 67, and 68, and the capacitors 69, 70, and 71, will be replaced by the respective resistor banks and capacitor groups of the control bank.

The elements comprising the triple unit are similar to these of the single unit above described. Resistor bank 66′ consists of a plurality of groups of series-connected resistors, 96, 96a, and 96b being shown, the said groups being connected in parallel in the lead from terminal 93. Between adjacent resistors there are contact terminals 97, 97a, and 97b with which movable contacts 98, 98a, and 98b engage to close the circuits. Resistor bank 67′ is similar to 66′, consisting of groups containing resistors 96′, 96a′, and 96b′ with contact terminals 97′, 97a′, and 97b′ between said resistors, and with movable contacts 98′, 98a′, and 98b′ to close the circuits. Likewise, resistor bank 68′ is similar, consisting of groups containing resistors 96″, 96a″, and 96b″ with contact terminals 97″, 97a″, and 97b″ between said resistors, and with movable contacts 98″, 98a″, and 98b″ to close the circuits. In capacitor group 69′ there is a plurality of capacitors 99, 99a, and 99b connected in parallel in the lead from terminal 95. These capacitors are also connected through leads with contact terminals 100, 100a, and 100b, and movable arm 101 serving terminal 102 selectively connects with one of the terminals 100, 100a, or 100b to place one of the capacitors in the circuit. The capacitor group 70′ is similar to 69′ consisting of capacitors 99′, 99a′, and 99b′ which are connected to contact terminals 100′, 100a′, and 100b′, and with movable contact arm 101′. Likewise, the capacitor group 71′ is similar, consisting of capacitors 99″, 99a″, and 99b″, contact terminals 100″, 100a″ and 100b″, and movable contact arm 101″.

To maintain contact arms 98, 98′ and 98″ on corresponding contacts, there is provided a mechanical linkage indicated at 103. A similar linkage 103a is provided for contact arms 98a, 98a′, and 98a″, and a similar linkage 103b for contact arms 98b, 98b′, and 98b″. Further, a similar linkage 104 is provided between the contact arms 101, 101′, and 101″.

In the multiple unit RC control banks provision is made for holding corresponding movable contacts of the different units on corresponding contact points by means of the mechanical linkage indicated at 91, 91a, 91b, and 92 in the double unit, and at 103, 103a, 103b, and 104 in the triple unit. As explained above, the purpose of this is to maintain the resistance and capacitance of each unit the same to satisfy conditions leading to the equation:

$$f=\frac{K}{RC}$$

and to permit operation of the unit by a single calibrated control. One embodiment of such mechanical linkage, as illustrated in Figure 9 is suitable for a double unit such as shown in Figure 7. The control bank is mounted in a suitable housing 113 which has one side as a control panel 114, an elevation of which is shown in Figure 10. On this control panel there is provision for connection with the terminals 82, 82′, and 83, and 83′, and dial knobs 105, 105a, 105b, and 106. In housing 113 the terminals 85—85b′ and 88—88b′ are arranged in circular patterns with movable contact arms 86—86b′, 89, and 89′ thereof. The contact arms 86a and 86a′ to rotate synchronously; movements of knob 105b cause contact arms 86b and 86b′ to rotate synchronously; and movements of knob 106 cause contact arms 89 and 89′ to rotate synchronously. It follows that proper arrangement of the contacts 85—85b′, and 88—88b′ will result in attaining the same resistance and the same capacitance in both parts of the double unit.

A similar embodiment may be developed for the triple unit RC control bank by extending the elements described above; and a single unit may be developed by using fewer elements; therefore such units are not shown in the drawings.

One of the principal advantages of the improved RC control bank is its adaptability to calibration readable directly in terms of frequency derviing from the physical properties of the circuits above described. For instance, referring to Figure 6, it is feasible to calibrate the groups of resistors 76, 76a, and 76b in decades, so the five resistors in circuit in group 76 would represent a frequency of 500, the three resistors in circuit in group 76a would represent a frequency of 70, and the eight resistors in circuit in group 76b would represent a frequency of 2. The equivalent resistance of the three groups in parallel would then represent a frequency of 572. Now, if the capacitor 79 was calibrated for a frequency of 1, the unit, consisting of the resistors and capacitor would be responsive to a frequency of 572. If capacitor 79a were calibrated for a frequency of 10, and capacitor 79b were calibrated for a frequency of 100, the unit would be responsive to a frequency of 5720 when contact arm 81 was shifted from contact 80 to 80a, and the unit would be responsive to a frequency of 57200 when contact arm 81 was shifted to contact 80b.

If the double unit of Figure 7 were calibrated in the same manner, the six resistors in circuit in groups 84 and 84′ would represent a frequency of 400, the three resistors in circuit in groups 84a and 84a′ would represent a frequency of 70, and the nine resistors in circuit in groups 84b and 84b′ would represent a frequency of 1. The resulting frequency of the combined resistors would hence be 471, but with the contact arms 89 and 89' placing capacitors 87b and 87b' in circuit, the frequency of the double unit would be 47100 assuming that capacitors 87b and 87b' were calibrated for a frequency of 100. An examination of the dials shown in Figure 10 indicates the ease with which the resulting frequency may be read, and the ease with which adjustments may be made. For instance, if dial 105a were moved from 7 to 4, the frequency would then be 44100.

If the triple unit of Figure 8 were calibrated in the same manner, it is to be seen that the frequency as indicated would be 742.

This advantageous adaptability to calibration of the unit is possible by virtue of the relationship of frequency to resistance and capacitance, which may be expressed as:

$$f=\frac{K}{RC}$$

and the relationship of effective resistance to the resistance of elements placed in parallel groups $$R=\frac{1}{\frac{1}{r}+\frac{1}{r_a}+\frac{1}{r_b}}$$

where R is the effective resistance, and $r$, $r_a$, and $r_b$ represent the resistance of the elements, as in 76, 76a, and 76b of Figure 6. From these relations it may be easily seen that if the resistor elements in the circuit, such as 76, 76a, 76b, were calibrated directly in terms of frequency, and if the capacitor, such as 79 was also calibrated in terms of frequency with proper allowance for the constant K in the above expression, that the frequency of the unit could be represented by the simple expression $$f=f_{79}(f_{76}+f_{76a}+f_{76b})$$

Analysis of this expression will show the advantage of calibrating the resistors in groups 76, 76a, and 76b in decades, and calibrating the capacitors in exponential multiples of the decades.

While the frequency is based upon the relation:

$$f=\frac{K}{RC}$$

as far as calibration of the resistors in a group, such as 76b, is concerned the expression may be assumed to be:

$$f=\frac{1}{R}$$

It follows that to obtain increments of frequency in evenly spaced intervals in calibrating the resistors, as at 109 in Figure 11, the corresponding values of resistance at 110 will be variable. It follows that the inverse properties of the relation of frequency to resistance is essentially hyperbolic, as at 112, and that the calibration of the resistors may be attained by use of such relation.

In the aforementioned disclosures of the several embodiments, the resistors of each group were shown series-connected with contact terminals between adjacent resistor elements and with movable contact to place the desired number of resistors in the circuit, such as resistors 76, contact terminals 77, and movable contact 78 of Figure 6. In another embodiment, such as is shown in Figure 12, the resistors of a group may be placed in parallel, as at 76', with contact terminals at 77' at the end of each element, whereby movable contact 78' may place the desired resistor in circuit. While in this embodiment the individual resistors will not have the same values as those of 76 in Figure 6, the manner of calibration will be the same in that the total resistance in circuit with the movable contact 78' at a given contact terminal 77' will be the same as with the movable contact 78 at a given corresponding contact terminal 77, Figure 6, if both embodiments are calibrated to indicate the same frequencies.

While I have described several embodiments of my invention, other embodiments and uses will become apparent to those skilled in the art, and I desire in no way to be restricted in the scope of my invention except by the appended claims.

What I claim is:

1. An incremental frequency control and indicator bank comprising, groups of series-connected, fixed-value resistors, all said groups having a common terminal, a tap for each resistor of each of said groups, a contact for each of said groups adjustable to selectively engage the taps thereof, a lead interconnecting said contacts in parallel, a plurality of fixed-value capacitors having a common terminal, and means adjustable to connect said lead and a selected one of said capacitors in circuit-completing relation.

2. The bank according to claim 1, wherein said means is arranged to couple the resistor groups through their contacts and said lead in series with the selected capacitor.

3. The bank according to claim 1, wherein said means is arranged to couple the resistor groups through their contacts and said lead in parallel with the selected capacitor.

4. An incremental frequency control and indicator bank comprising, groups of series-connected, fixed-value resistors, all said groups having a common terminal, a tap for each resistor of each of said groups, a supplementary tap in each of said groups operatively aligned with the resistor taps thereof and unconnected to the group, a contact for each of said groups adjustable to selectively engage the resistor taps and supplementary tap thereof, a lead interconnecting said contacts in parallel, a plurality of fixed-value capacitors having a common terminal, and means adjustable to connect said lead and a selected one of said capacitors in circuit-completing relation.

5. In a Wien-type bridge having a pair of input leads, a pair of output leads, a pair of like bridge circuit legs connecting said input leads with one of the output leads through identical fixed-value resistors, and a second pair of bridge circuit legs connecting said input leads with the other of the output leads, a selectively-adjustable frequency control bank in each of said second pair of bridge circuit legs, each of said banks comprising groups of series-connected, fixed value resistors, all said groups having a common terminal, a tap for each resistor of each of said groups, a contact for each of said groups adjustable to selectively engage the taps thereof, a lead interconnecting said contacts in parallel, a plurality of fixed-value capacitors having a common terminal, and means adjustable to connect said lead and a selected one of said capacitors in circuit-completing relation, the said means in one of the second pair of bridge circuit legs being arranged to couple the resistor groups through their contacts and said lead in series with the selected capacitor of the associated bank and the said means in the other of said pair of bridge circuit legs being arranged to couple the resistor groups through their contacts and said lead in parallel with the selected capacitor of the associated bank.

SAMUEL PAYNE.

REFERENCES CITED

The following references are of record in the file of this patent:

UNITED STATES PATENTS

| Number | Name | Date |
|---|---|---|
| 2,236,985 | Bartelink | Apr. 1, 1941 |
| 2,444,084 | Artzt | June 29, 1948 |

FOREIGN PATENTS

| Number | Country | Date |
|---|---|---|
| 524,314 | Great Britain | Aug. 2, 1940 |